United States Patent [19]

Schade, Jr.

[11] 4,126,830

[45] Nov. 21, 1978

[54] LOW LEAKAGE GATE PROTECTION CIRCUIT

[75] Inventor: Otto H. Schade, Jr., North Caldwell, N.J.

[73] Assignee: RCA Corporation, New York, N.Y.

[21] Appl. No.: 837,280

[22] Filed: Sep. 27, 1977

[51] Int. Cl.² ............................................. H03F 3/16
[52] U.S. Cl. .................................. 330/277; 307/304; 330/254; 330/298
[58] Field of Search .................... 330/207 P, 277, 298, 330/253; 307/304; 361/56, 91

[56] References Cited

U.S. PATENT DOCUMENTS 3,870,968  3/1975  Vosteen et al. ..................... 330/298

Primary Examiner—James B. Mullins

Attorney, Agent, or Firm—H. Christoffersen; Henry I. Schanzer

[57] ABSTRACT

The protection circuit for a first, signal amplifying, insulated-gate field-effect transistor (IGFET) whose gate electrode is connected to an external signal input terminal includes a second IGFET whose gate is also connected to the input terminal. The gate insulators of the IGFETs are protected by a network which includes a, normally reverse biased, diode connected between the gates of the IGFETs and a first node. The second IGFET forms the input of a unity voltage gain, non-inverting, buffer amplifier whose output is applied to the first node whereby a voltage of approximately the same value as the input voltage is applied to the first node. The buffer amplifier thus maintains the voltage across the gate protection diode at approximately zero volt, thereby substantially reducing its leakage current.

5 Claims, 2 Drawing Figures

LOW LEAKAGE GATE PROTECTION CIRCUIT

The present invention relates to a protective network for insulated-gate field-effect devices and to means for reducing leakage currents associated with the protective network.

It is well known that protective networks are needed to prevent potential differentials greater than a predetermined level from being applied across the gate insulators of IGFETs or between selected electrodes of IGFETs. Known protection circuits, such as described in U.S. Pat. No. 3,897,640, issued to the present applicant and assigned to RCA Corporation, include diodes connected to the gates of IGFETs for electrostatic and overvoltage protection. However, a problem exists with the diode network in that the diodes, although designed and processed very carfully, pass a leakage current into or from the gates which are connected to the input terminals of the amplifier. Even though the leakage current may be very small (i.e. in the nanoampere range), there are many applications such as smoke detectors, timing circuits, sample and hold circuits, and high impedance instruments, in which it is desirable and/or necessary to have extremely low leakage currents (i.e. in the picoampere or subicoampere range).

It is also known, as described in U.S. Pat. No. 4,044,313 issued to Wittlinger et al and assigned to RCA Corporation, to have a differential amplifier whose input stage comprises two IGFETs having protection diodes connected between their gates and to derive a unity-gain non-inverting voltage from the output of the amplifier which is then applied to the one of the protection diodes to which an input signal is applied for substanially reducing its leakage current.

In Wittlinger et al, the amplifier must produce an output, responsive to the input, which is suitable to maintain the voltage across the protection diode close to zero while at the same time processing the input signal. This places severe constraints upon the amplifier and diminishes its flexibility.

In contrast thereto, circuits embodying the invention include a diode protected IGFET input amplifier for processing the signal and a separate buffer amplifier for reducing the leakage of the protection diode.

A circuit embodying the invention includes means for applying an external input signal in parallel with the gate electrodes of first and second IGTFETs. The first IGFET is designed to process the signal and can produce an amplified signal at its drain or a follower signal at its source. The second IGFET is the input stage of a non-inverting, unity voltage gain, amplifier whose output is designed to equal and follow the input and which is applied to one end of a protection diode whose other end is connected to the gates of the first and second IGFETs. This maintains the voltage across the protection diode close to zero and its leakage current extremely low. Thus, in circuits embodying the invention, the signal processing and leakage reduction functions are separated.

In the accompanying drawing.

Figure 1:
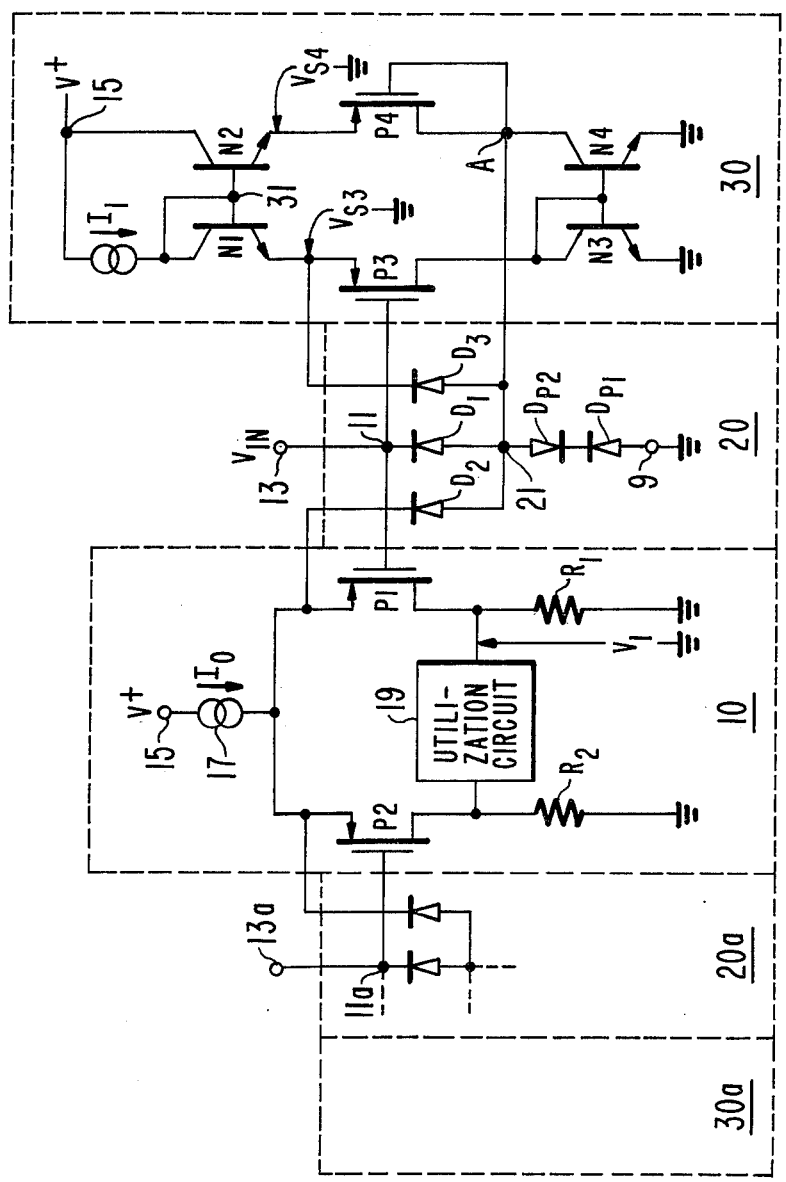
FIG. 1 is a schematic diagram of a circuit embodying the invention.

The circuit of FIG. 1 includes a signal amplifier 10, diode protection networks 20 and 20a designed to protect the input IGFETs of amplifier 10, and buffer amplifiers 30 and 30a, designed to produce approximately zero volts across those diodes of the protection network connected to the gates of the input IGFETs.

Amplifier 10 is a differential amplifier comprised of P-channel IGFETs P1 and P2. The gates of IGFETs P1 and P2 are connected to input terminals 13 and 13a, respectively. The gate protection circuit 20 and the leakage reduction circuit 30 associated with the gate of IGFET P1 are identical to the circuits 20a and 30a, respectively, associated with the gate of P2. Therefore, only the former are shown and discussed in detail.

A current source 17 is connected between the source electrodes of P1 and P2 and a terminal 15 to which is applied a positive operating potential of V+ volts. A resistor R1 is connected between the drain of transistor P1 and ground. The signal generated at the drain of P1 is applied to a utilization circuit 19 connected to the drain. The drain current as well as the drain voltage of P1 can be used to drive the utilization circuit. There are no constraints in the way in which P1 may be used by itself, or in combination with P2, or any other device to modify or amplify the signals applied to its gate.

Input terminal 13 is also connected to the gate of P-type IGFET P3 which functions as the input of buffer amplifier 30.

The user of an IGFET, P3, as the input to amplifier 30 ensures that it does not load down the input signal and that an extremely high input impedance is maintained.

The source of IGFET P3 is connected to the emitter of a bipolar NPN transistor N1 whose collector is connected via a current source I1 to terminal 15 to which is applied V+ volts. The base and collector of transistor N1 are connected in common to the base of another bipolar NPN transistor N2 at node 31. The collector of N2 is directly connected to terminal 15 and its emitter is connected to the source of an IGFET P4. The gate and drain of IGFET P4 are connected in common to node A which defines the output of amplifier 30. Node A is connected to region 21 of network 20 via a low impedance connection.

The drain of transistor P3 is connected to the collector and base of a bipolar NPN transistor N3 and to the base of an NPN transistor N4. The collector of transistor N4 is connected to node A and the emitters of transistors N3 and N4 are connected to ground.

Transistors N3 and N4 form a current mirror, and where these transistors are manufactured with similar geometries their collector-to-emitter currents will, to a first approximation, be equal. If the collector-to-emitter currents through N3 and N4 are equal, then the source-to-drain currents ($I_{DS}$) of transistors P3 and P4 will also be equal. The importance of this feature is that passing equal souce-to-drain currents ($I_{DS}$) through transistors P3 and P4 causes their gate-to-source voltages ($V_{GS}$) to be approximately equal, assuming the two IGFETs to have approximately the same geometries and to be made in the same manner.

It will now be shown that the voltage ($V_A$) produced by amplifier 30 at node A is very nearly equal to $V_{IN}$. The voltage ($V_{S3}$) at the source of P3 is equal to $V_{IN} + V_{GS3}$, where $V_{GS3}$ is the $V_{GS}$ of P3. The voltage ($V_{31}$) at the bases of transistors N1 and N2 is equal to $V_{IN} + V_{GS3} + V_{BEN1}$, where $V_{BEN1}$ is the $V_{BE}$ of transistor N1. Assuming the $V_{BE}$ of transistors N1 and N2 to be nearly equal, then the voltage ($V_{S4}$) at the souce of transistor P4 is one $V_{BE}$ drop below the voltage at $V_{31}$. Hence $V_{S4}$ is approximately equal to $V_{S3}$ or $V_{IN} +$ $V_{GS3}$. Since the gate of P4 is connected to its drain, its source-to-gate voltage ($V_{GS4}$) drop is equal to its source-to-drain voltage ($V_{DS4}$) drop. Furthermore, since approximately the same currents are passed through P3 and P4, $V_{GS3}$ is approximately equal to $V_{GS4}$ and the voltage ($V_A$) at node A is $V_{GS3}$ volts less than $V_{S4}$. Hence, $V_A$ is approximately equal to $V_{IN}$. Thus, $V_{IN}$ is level shifted up by P3 and N1 and then level shifted down by N2 and P4 which generate a potential approximately equal to $V_{IN}$ at node A.

The buffer amplifier 30 may be viewed as a slave amplifier whose input is connected to input terminal 13 and at whose output (node A) is produced a non-inverting output with a voltage gain of approximately 1. There is power gain at node A and transistors P4 and N4 can supply or draw the current to drive node 21 to equal $V_{IN}$.

The gate insulators of IGFETs P1 and P3 are protected against electrostatic stresses and overvoltage by diode network 20 which comprises diode (PN junction) D1 connected at its cathode (e.g. N-region) to the gates of P1 and P3 and diodes D2 and D3 connected at their cathodes (e.g. N-regions) to the sources of IGFETs P1 and P3, respectively. The protection diode network, although it causes leakage current to flow at the amplifier inputs, is absolutely necessary to protect the IGFETs during handling and assembly and to prevent the application of overvoltages across the gate insulators. It prevents the potential between the gate and the source regions of the transistors from exceeding $|V_R + V_F|$ volts; where the diodes are assumed to have equal breakdown (reverse) voltages, $V_R$, and equal forward drops, $V_F$.

In most bulk silicon integrated circuits suitble for the manufacture of IGFETs for linear circuit applications a parasitic leakage path is formed concurrently with the formation of the protection diodes as described, for example, in U.S. Pats. Nos. 3,879,640 and 4,044,313.

The anodes (e.g. P-regions) of diodes D1, D2 and D3 share a common region 21 (e.g. of P conductivity type) with which there is associated a parasitic leakage path. The leakage path includes a diode, DP2, connected at its anode to region 21 and a leaky, low back impedance, diode DP1 connected at its cathode to the cathode of diode DP2. The most negative circuit potential (GND in FIG. 1) is applied to the anode 9 of diode DP1. Consequently, diode DP1 is normally reverse biased and diode DP2 is normally forward biased. The potential or signal level applied to the cathodes of diodes D1, D2 or D3 is normally more positive than the potential established within region 21 which, if left floating, tends to be close to GND.

The protective diodes are, therefore, normally reverse biased throughout the linear and useful range of operation. (Where the circuit is made with discrete components separate means would be provided to keep the diodes reverse biased in the normal range of operation). Each protective diode provides a relatively high impedance path in series with the lower impedance leakage path of diodes DP1, DP2 and effectively isolates the parasitic leakage path from the electrodes or nodes being protected.

To match the extremely high input impedance of the IGFETs, the protective diodes D1, D2 and D3 are especially designed to have minimum leakage currents, under reverse bias conditions, in the range of picoamperes ($10^{-12}$ amperes). However, since these diodes are normally reverse biased, leakage currents can flow from the signal source connected to terminal 13 through diode D1 and from the positive operating source at terminal 15 through diodes D2 and D3. However, the leakage currents through diodes D2 and D3 connected to the operating potentials are not of significant concern since they do not affect the signal input sources. It is the leakage at the signal input terminal which is of concern. Although the leakage currents drawn from the input terminals or supplied into the input terminals are small, the circuit operation may be significantly and deleteriously affected and in some applications is not tolerable. A diode connected to the gate of the IGFET even if it permits leakage currents in the picoampere range reduces the effective input impedance of the IGFET amplifier to the range of $10^{12}$ ohms. This may be a high impedance in some applications. But, as a rule, it diminishes the benefits associated with the extremely high input impedance of the IGFET input stage.

The circuit of FIG. 1 includes means for reducing, substantially, the leakage current flow through the protective diodes with no reduction in the protection of the gate insulators against electrostatic and overvoltage stresses.

In the operation of the circuit of FIG. 1, the input signal applied to terminal 13 is applied to amplifier 30 which then bootstraps the anode of diode D1 to the voltage of the input signal. That is, amplifier 30 generates at node A and applies to region 21 (anode of D1) a voltage which is nearly equal to that at the input terminal (cathode of D1). Measurements made with circuits of the type shown in FIG. 1 in which the reverse voltage across diode D1 was maintained around 10 millivolts indicated leakage currents through D1 of only 10 to 100 femtoamperes ($10^{-15}$ amperes) over a wide temperature range (0° to 100° C.). While network 20 protects the IGFETs (P1 and P3) and amplifier 30 reduces the leakage through the network transistor P1 and amplifier 10 can process the input signal unconstrained by any of the consideration required to optimize protection and leakage reduction.

Figure 2:
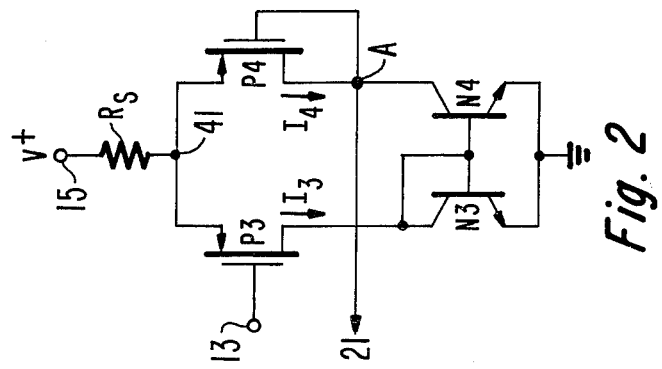
FIG. 2 is a schematic diagram of another buffer amplifier stage suitable for use in the circuit of FIG. 1.

The buffer amplifier 30 of FIG. 1 may be modified as shown in FIG. 2. The gate and drain circuits of the FIG. 2 amplifier are similar to those of amplifier 30 in FIG. 1, but the sources of transistors P3 and P4 are now connected to a common node 41 and a common source resistor $R_S$ is connected between the common node 41 and a point 15 of positive operating potential. Where, as before, P3 and P4 have similar geometries and are of similar manufacture and approximately equal currents are passed through their source-to-drain paths, then $V_{GS3}$ is equal to $V_{GS4}$ which is equal to $V_{DS4}$ and $V_A$ is approximately equal to $V_{IN}$ applied to node 13. This shows that different types of non-inverting, unity voltage gain, amplifiers may be used to produce the function of amplifier 30 shown in FIG. 1.

It should also be evident that since the signal processing and leakage reduction functions are separated, that the buffer amplifier 30 can be simple and slow without affecting the quality or fidelity of the processed signal. The separation of functions permits the optimization of the circuitry performing each function to handle that function.

What is claimed is:

1. The combination comprising:
   an input terminal adapted to receive an external input signal;

first and second insulated-gate field-effect transistors (IGFETs), each IGFET having a source, a drain and a gate;

means direct current connecting the gates of said first and second IGFETs to said input terminal;

means connecting said source of said first IGFET to a first point of operating potential and means connecting said drain of said first IGFET to a second point of operating potential for deriving a signal responsive to said input signal from at least one of its source and drain;

a protective network for said IGFETs comprising a plurality of diodes, each diode comprising a cathode region and an anode region; means connecting the same conductivity type region of said diodes to a first node; means connecting the other region of a first one of said diodes to said gates of said first and second IGFETs; means connecting the other region of a second one of said diodes to said source of said first IGFET; and means connecting the other region of a third one of said diodes to said source of said second IGFET; and means for reducing the flow of leakage current across said first diode comprising means connected between the source of said second IGFET and said first node responsive to the signal at the source of said second IGFET for generating a potential approximately equal to that at said input terminal and applying it to said first node.

2. The combination as claimed in claim 1 wherein said means connected between the source of said second IGFET and said first node includes:

a third IGFET connected at its gate and drain to said first node; and first and second bipolar transistors, each having a base, an emitter and a collector; means connecting the emitter of said first bipolar transistor to said source of said second IGFET; means connecting the emitter of said second bipolar transistor to said source of said third IGFET; and means connecting a current source to the collector and base of said first bipolar transistor and to the base of said second bipolar transistor.

3. The combination as claimed in claim 2 wherein said means for reducing the flow of leakage currents includes a current mirror connected to the drains of said second and third IGFETs comprising:

third and fourth bipolar transistors, each transistor having a base, an emitter and a collector, wherein said base and collector of said third bipolar transistor and said base of said fourth bipolar transistor are connected to the drain of said second IGFET; wherein said collector of said fourth bipolar transistor is connected to the drain of said third IGFET; and wherein the emitters of said third and fourth bipolar transistors are connected to a point of operating potential.

4. The combination as claimed in claim 1 wherein said means for reducing the flow of leakage currents across said diode includes a third IGFET, having a source, a drain, and a gate; and means connected to the sources of said second and third IGFETs for supplying currents thereto; and wherein a current mirror is connected to the drains of said second and third IGFETs for sampling the current in the source drain path of said second IGFET and causing approximately the same currents to flow in the source-to-drain path of said third IGFET; and wherein said means connected between the souce of said second IGFET and said first node includes means connecting the gate and drain of said third IGFET to said first node.

5. The combination comprising:

an input terminal adapted to receive an external input signal;

an insulated-gate field-effect transistor (IGFET) having a source, a drain and a gate;

means direct current connecting the gate of said IGFET to said input terminal; means connecting said source of said IGFET to a first point of operating potential and means connecting said drain of said IGFET to a second point of operating potential for deriving a signal responsive to the input from at least one of its sources and drain;

a protective network for said IGFET comprising a diode connected between the gate of said IGFET and a first node; and means for reducing the flow of leakage currents across said diode comprising a non-inverting voltage follower amplifier, independent of said IGFET, having an input and an output; means direct current connecting said amplifier input to said input terminal and means direct current connecting said amplifier output to said first node.

* * * * *